United States Patent
Zhao

(10) Patent No.: US 7,514,923 B2
(45) Date of Patent: Apr. 7, 2009

(54) METHOD FOR LOCALIZED EXCITATION FOR ACCURATE CENTER FREQUENCY MEASUREMENTS WITH MRI

(75) Inventor: Xiaoli Zhao, New Berlin, WI (US)

(73) Assignee: General Electric Company, Schenectady, NY (US)

( * ) Notice: Subject to any disclaimer, the term of this patent is extended or adjusted under 35 U.S.C. 154(b) by 148 days.

(21) Appl. No.: 11/269,103

(22) Filed: Nov. 7, 2005

(65) Prior Publication Data

US 2007/0103154 A1    May 10, 2007

(51) Int. Cl.
*G01V 3/00*      (2006.01)
*A61B 5/055*    (2006.01)

(52) U.S. Cl. .................... 324/309; 324/307; 600/410

(58) Field of Classification Search ......... 324/300–322; 600/407–435; 382/128–131
See application file for complete search history.

(56) References Cited

U.S. PATENT DOCUMENTS

| | | | | |
|---|---|---|---|---|
| 4,307,343 A * | 12/1981 | Likes | .................... | 324/307 |
| 4,573,015 A * | 2/1986 | Abe et al. | .................... | 324/309 |
| 4,593,247 A * | 6/1986 | Glover | .................... | 324/309 |
| 4,707,659 A * | 11/1987 | Kunz et al. | .................... | 324/309 |
| 5,029,009 A * | 7/1991 | Ulich et al. | .................... | 348/217.1 |
| 5,690,108 A * | 11/1997 | Chakeres | .................... | 600/424 |
| 5,827,942 A * | 10/1998 | Madsen et al. | .................... | 73/1.82 |
| 6,055,449 A * | 4/2000 | Navab | .................... | 600/427 |
| 6,064,904 A * | 5/2000 | Yanof et al. | .................... | 600/414 |
| 6,097,994 A * | 8/2000 | Navab et al. | .................... | 700/245 |
| 6,181,134 B1 * | 1/2001 | Wald | .................... | 324/307 |
| 6,320,381 B1 * | 11/2001 | Hennig | .................... | 324/312 |
| 6,575,969 B1 * | 6/2003 | Rittman et al. | .................... | 606/41 |
| 6,733,458 B1 * | 5/2004 | Steins et al. | .................... | 600/461 |
| 6,891,372 B2 * | 5/2005 | Steinhoff et al. | .................... | 324/309 |
| 6,900,632 B2 * | 5/2005 | Uetake | .................... | 324/307 |
| 6,922,054 B2 | 7/2005 | Hargreaves et al. | .................... | 324/307 |
| 6,995,559 B2 * | 2/2006 | Agilandam et al. | .................... | 324/309 |
| 7,245,958 B1 * | 7/2007 | Navab et al. | .................... | 600/407 |
| 2001/0003423 A1 * | 6/2001 | Wald | .................... | 324/307 |
| 2003/0003053 A1 * | 1/2003 | Uetake | .................... | 424/9.3 |
| 2003/0076098 A1 * | 4/2003 | Steinhoff et al. | .................... | 324/300 |
| 2005/0093541 A1 * | 5/2005 | Agilandam et al. | .................... | 324/309 |
| 2005/0154291 A1 * | 7/2005 | Zhao et al. | .................... | 600/410 |
| 2006/0274924 A1 * | 12/2006 | West et al. | .................... | 382/131 |
| 2008/0279436 A1 * | 11/2008 | Razifar et al. | .................... | 382/131 |

* cited by examiner

*Primary Examiner*—Brij B Shrivastav
*Assistant Examiner*—Tiffany A Fetzner
(74) *Attorney, Agent, or Firm*—Cantor Colburn LLP

(57) ABSTRACT

Disclosed herein is a method for defining a localized excitation volume within a localizer image, comprising: choosing a region of interest within the localizer image, prescribing at least one imaging slab, and defining a localized excitation volume contained within the region of interest and encompasses a portion of the at least one imaging slab. Further disclosed herein is a method for measuring an accurate center frequency, comprising: prescribing a region of interest within a localizer image, prescribing at least one imaging slab bisecting the region of interest, defining a localized excitation volume that is substantially contained within the region of interest and encompassing a portion of the imaging slab, exciting the localized excitation volume, and calculating a center frequency peak for the localized excitation volume in spectral domain after a fast Fourier transform (FFT) process.

17 Claims, 5 Drawing Sheets

METHOD FOR LOCALIZED EXCITATION FOR ACCURATE CENTER FREQUENCY MEASUREMENTS WITH MRI

BACKGROUND OF THE INVENTION

The disclosed invention relates generally to a magnetic resonance imaging (MRI) system and method of use thereof, and more specifically to improved center frequency measurement.

MRI systems have become a valuable imaging tool in the medical field due to the high quality of images they provide, and to their capability of distinguishing different tissue types from one another. A particular method frequently employed for such application as cardiac imaging, for example, is balanced steady-state free precession (SSFP) imaging. SSFP is chosen for its high signal-to-noise ratio (SNR) and fast acquisition times. However, one drawback of SSFP is that it is very sensitive to errors in center frequency and field inhomogeneity. An inaccurate center frequency may result in severe banding artifacts and flow artifacts in the images.

Center frequency measurement also plays a critical role in applications involving fat suppression. An erroneously measured center frequency may cause inadequate fat suppression and water signal loss.

Some current methods for center frequency measurements in the magnetic resonance imaging industry are based on "global" excitation. "Global" excitation occurs when the slab or slice that defines the excitation volume continues outside a region of interest (ROI) volume. This "global" excitation excites irrelevant tissue, which is tissue that lies outside of the ROI volume. The irrelevant tissue often has NMR (nuclear magnetic resonance) frequencies different from that of the relevant tissue (the tissue that lies within the ROI and is the target of the imaging). As a result, the spectrum (acquired from the NMR signal after performing fast Fourier transforms (FFT) and other signal processing procedures) has multiple peaks surrounding the center frequency peak. These multiple peaks make it difficult to determine the true center frequency, resulting in the use of erroneous center frequency peaks. Stated another way, the NMR signal received is contaminated with irrelevant, out-of-phase spins from tissue located outside the ROI resulting in errors of center frequency measurement.

Use of erroneous center frequencies may result in images that contain artifacts. Accordingly there is a need in the art for improved methods of center frequency measurement.

BRIEF DESCRIPTION OF THE INVENTION

An embodiment of the invention includes a method for defining a localized excitation volume within a localizer image, comprising: choosing a region of interest within the localizer image, prescribing at least one imaging slab bisecting the region of interest, and defining a localized excitation volume that is substantially contained within the region of interest and encompasses a portion of the at least one imaging slab.

Another embodiment of the invention includes a method for measuring an accurate center frequency with respect to a localizer image, comprising: prescribing a region of interest within the localizer image, prescribing at least one imaging slab bisecting the region of interest, defining a localized excitation volume that is substantially contained within the region of interest and encompasses a portion of the at least one imaging slab, exciting the localized excitation volume, and calculating a center frequency peak for the localized excitation volume in spectral domain after a fast Fourier transform (FFT) process.

BRIEF DESCRIPTION OF THE DRAWINGS

The following descriptions should not be considered limiting in any way. With reference to the accompanying drawings, like elements are numbered alike.

DETAILED DESCRIPTION OF THE INVENTION

A detailed description of several embodiments of the disclosed method is presented herein by way of exemplification and not limitation with reference to the Figures.

Figure 1:
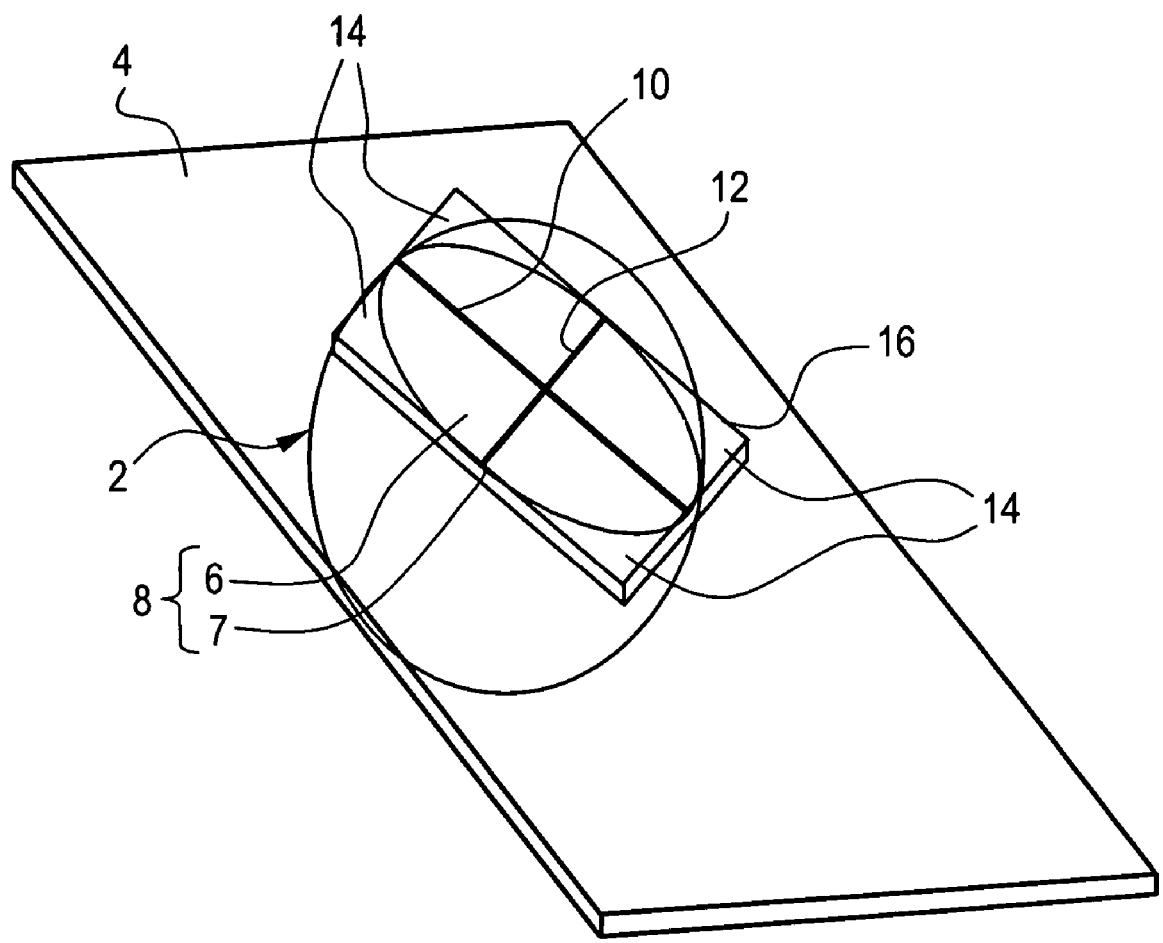
FIG. 1 depicts an explanatory view of a geometric representation of an embodiment of the invention.

Referring to FIG. 1, an explanatory view of an embodiment of the invention is shown. MRI imaging protocol begins with defining a region of interest (ROI) that encompasses the particular body tissue that is to be imaged. In FIG. 1 this ROI 2 is in the shape of an ellipsoid. A prescribed imaging slab or slice 4 bisects the ROI 2. Since the difference between an imaging slab and an imaging slice is the thickness thereof, and all possible thicknesses are acceptable and within the scope of embodiments of the invention, the term slab will be used throughout the balance of this disclosure to designate either a slab or a slice. Calculations of the intersections of the ellipsoid ROI 2 with the slab 4 result in an ellipse 6 with thickness 7, length 10 and width 12, which hereafter is called the elliptical localized excitation volume 8.

The volume of the elliptical localized excitation volume 8 is mostly filled with tissue that is to be imaged (relevant tissue). Therefore, exciting only the tissue in the elliptical localized excitation volume 8 will result in fewer center frequency peaks than if all the tissue of the volume of slab 4 were excited; since the tissue within the slab 4 that is external to the elliptical localized excitation volume 8 is tissue that is not to be excited (irrelevant tissue).

Exciting a volume of the geometric shape of the elliptical localized excitation volume 8 can be achieved by using a slice-selective 2D spatial excitation pulse. A simpler way is to use PRESS (point-resolved spectroscopy) or STEAM (stimulated echo acquisition mode) to excite a rectangular prism that is a close approximation to the elliptical localized excitation volume 8. The rectangular prism localized excitation volume 16 defined by length 10, width 12 and thickness 7, for example, closely approximates the elliptical localized excitation volume 8. The difference being the four small corner volumes 14 of rectangular prism localized excitation volume 16 that lies outside of elliptical localized excitation volume 8. In view of the foregoing, volume 16 may be viewed as being substantially contained within ROI 2.

The two techniques for exciting the localized excitation volume 16 are: stimulated echo acquisition mode (STEAM) and point-resolved spectroscopy (PRESS). Compared to STEAM, PRESS provides a two-fold gain in signal intensity and is less sensitive to patient motion. Although either method may be employed, PRESS is the volume localized excitation method most often used in clinical spectroscopy.

Figure 2:
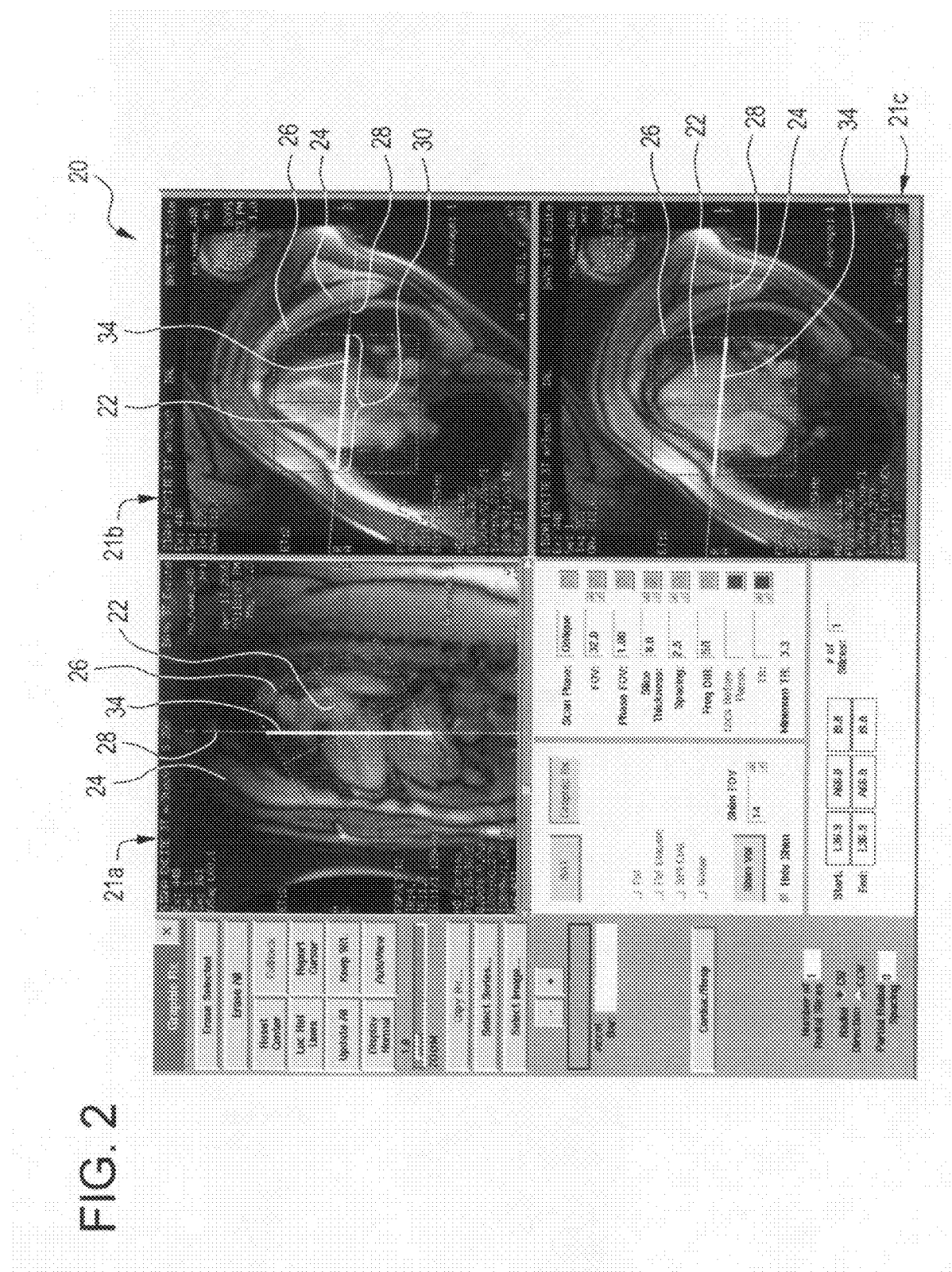
FIG. 2 depicts a display of an exemplary control panel view in accordance with embodiments of the invention.
Figure 3:
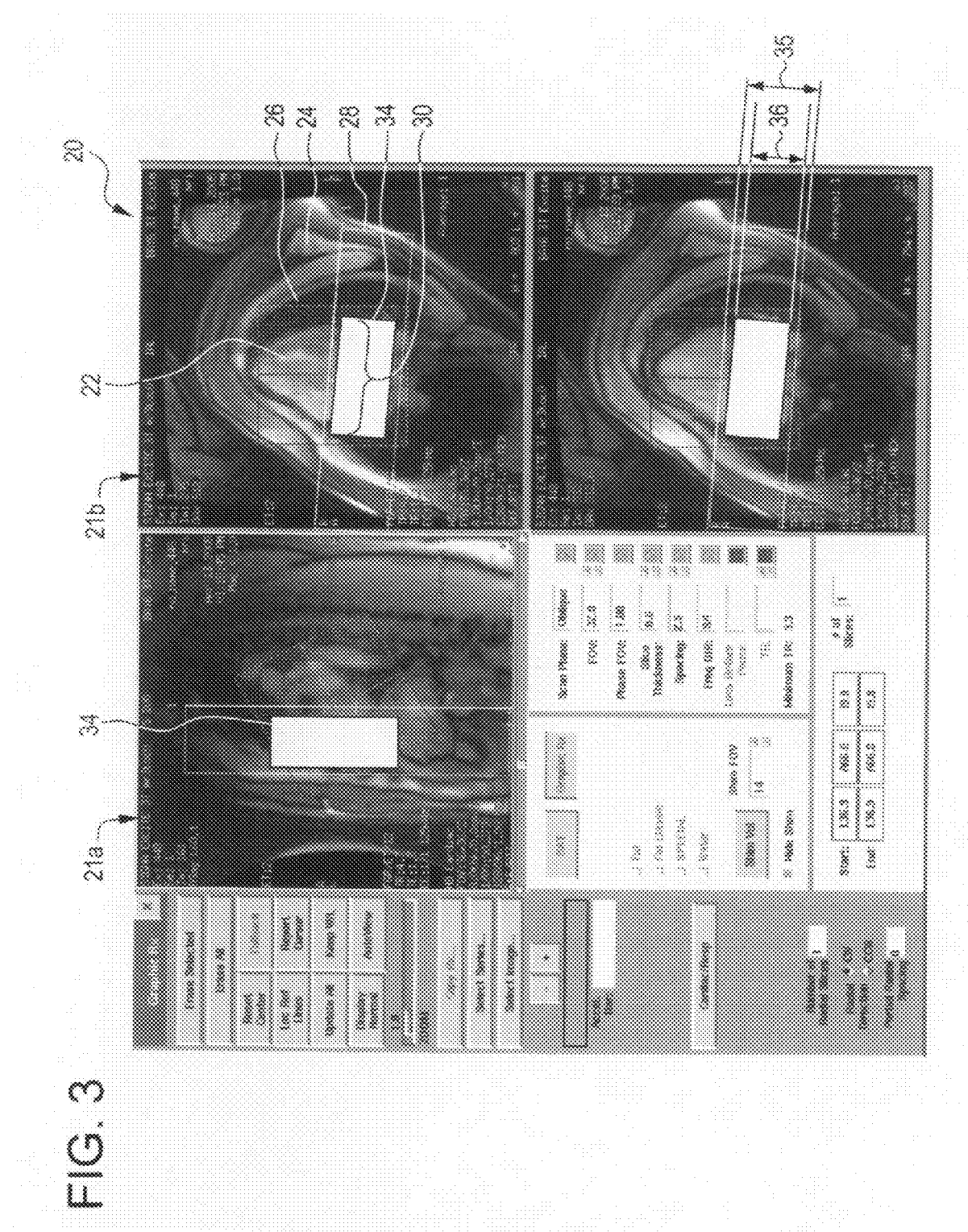
FIG. 3 depicts another display of an exemplary control panel view in accordance with embodiments of the invention.
Figure 4:
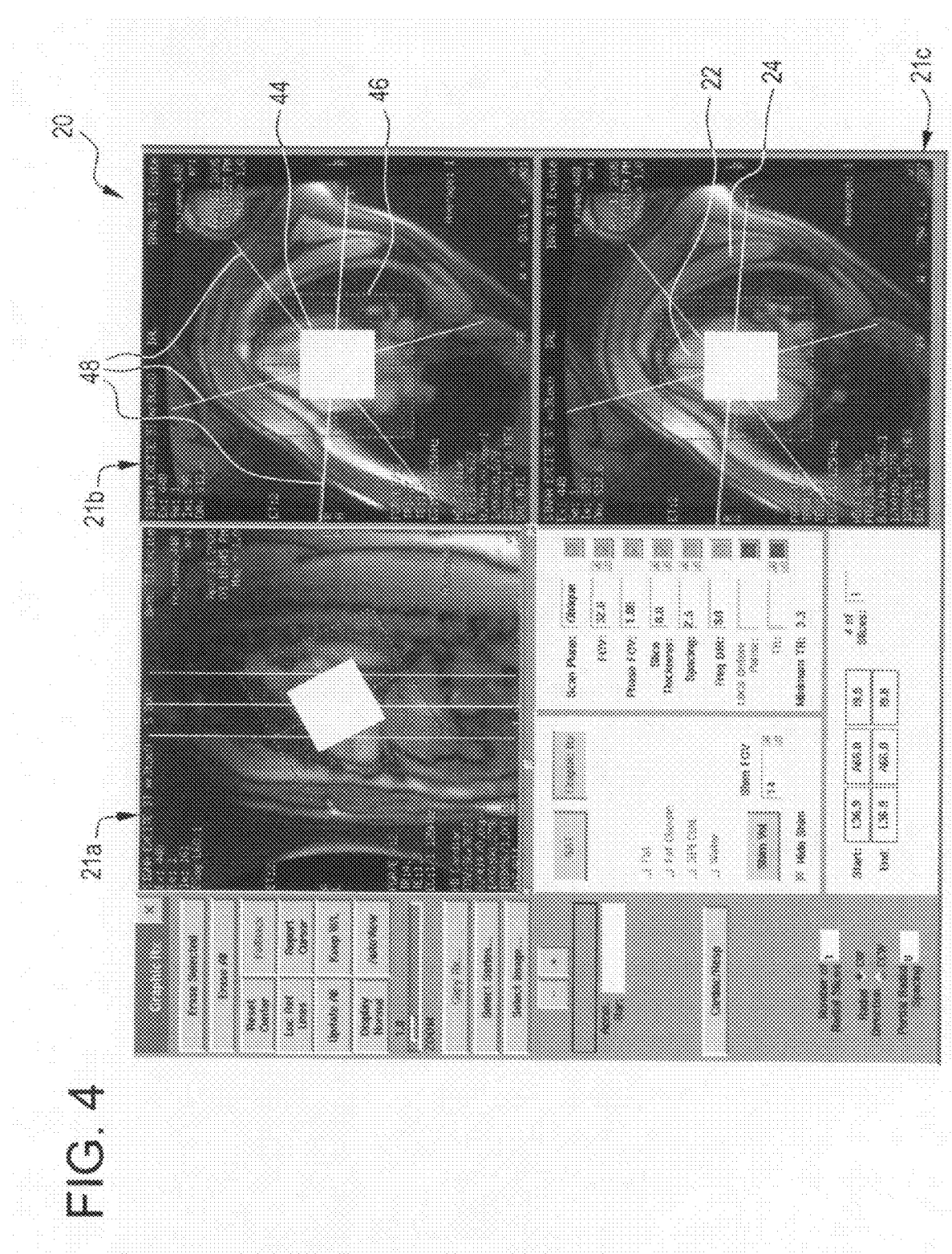
FIG. 4 depicts another display of an exemplary control panel view in accordance with embodiments of the invention.

Referring to FIGS. 2-4, an MRI system monitor control screen 20, with three localizer images 21 a, b, c, of the chest area is shown. The three localizer images show the primary sectioning views of the human body, namely the axial, coronal and sagittal planes. MRI system operators use localizer images 21a, b, c to prescribe the planes that will be used for imaging. In the exemplary embodiment illustrated, the localizer images 21a, b, c show a heart 22 and the surrounding tissue 24. However, it will be appreciated that embodiments of the invention may be applied to any anatomical object under study. A cubical ROI 26 is positioned within the localizer images 21a, b, c to encompass the heart 22. The cubical ROI 26 defines the ellipsoid ROI 2 that is enclosed by cubical ROI 26, the enclosed ellipsoid ROI 2 is used to calculate the size and orientation of the elliptical localized excitation volume 8 as shown in FIG. 1. The ROI 26 shown here is in the shape of a cube, however, a generic rectangular prism can be used, or an ellipsoid can be directly used. As depicted, ROI 26 is represented using dotted lines illustrating of a mesh.

Similar to the process described above, in another embodiment of the invention, one or more imaging slabs 28 are prescribed in the localizer images 21 a, b, c bisecting the ROI 26 and the heart 22 in a location and orientation chosen to show the portion 30 of the heart 22 that is to be imaged. The intersections of the slab 28 with the ROI 26 are calculated to determine the localized excitation volume 34. If the slab 28 only consists of a single slice (FIG. 2), this single slice is used to calculate the intersection. If the slab consists of multiple slices (FIG. 3), the center slice is used for the intersection calculation. The length, width and orientation of the intersection will be calculated as shown in FIG. 1. The thickness of the localized excitation volume 34 can be made to match the thickness of the slab 28 as shown with the thin slab 28 of FIG. 2, or the thickness of the localized excitation volume 34 can be made thinner, or thicker, than the thickness of the imaging slab 28. For example the localized excitation volume 34 of FIG. 3 has thickness 36 that is thinner than the thickness 35 of the imaging slab 28.

Referring to FIG. 4, another embodiment of the invention is shown. Three imaging slabs 48 intersect one another near the center of a ROI 46. A localized excitation volume 44 is chosen as a percentage of the ROI 46, thereby maintaining the same shape as the ROI 46, in this instance a cube, while making it smaller.

Figure 5:
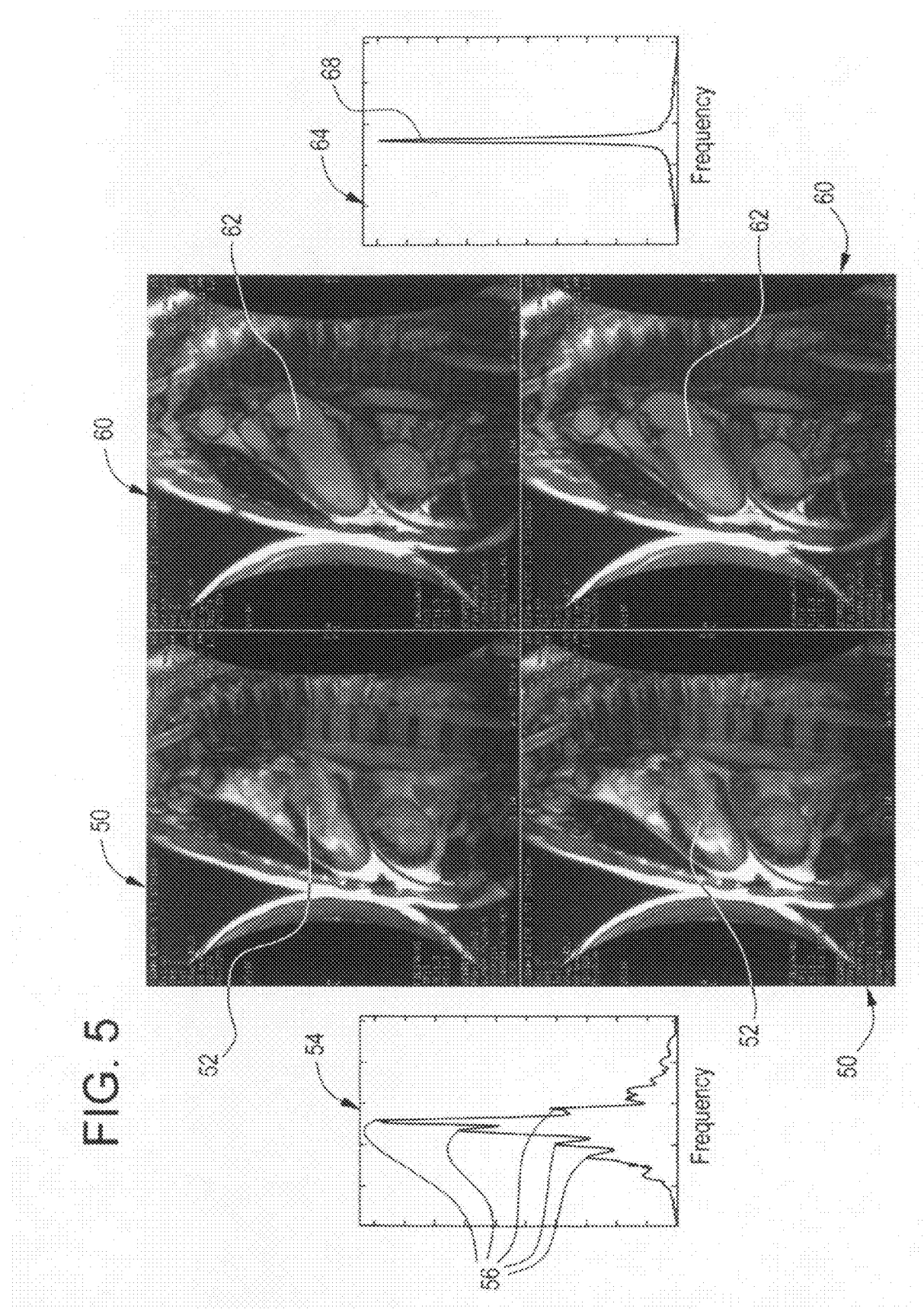
FIG. 5 depicts a comparison of images and spectrum with and without embodiments of the invention.

Referring now to FIG. 5, a comparison of images is made between the views on the left without embodiments of the invention to the views on the right with an embodiment of the invention. The images 50 were made without embodiments of the invention and artifacts 52 are observable within the images 50, whereas the images 60 were made with methods of embodiments of the invention and location 62, where artifacts 52 exist on images 50, are shown to be free of such artifacts.

The artifacts 52 are the result of using an inaccurate center frequency. The center frequency is determined from a spectrum 54 that is generated after performing fast Fourier transforms and additional signal processing of the nuclear magnetic resonance signals. The spectrum 54 shows multiple frequency peaks 56. These multiple peaks 56 make determining the center frequency difficult and often result in erroneous center frequency being determined. Spectrum 64, in accordance with an embodiment of the invention, shows a center frequency 68, without multiple peaks surrounding it, resulting in highly accurate center frequency 68 determination.

The center frequency difference between that determined in spectrum 64 and that determined in spectrum 54 is actually 183 Hz that is responsible for the undesirable artifacts 52 found in the MRI images 50.

Some embodiments of the invention may have some of the advantages of: exciting mainly tissue within the region of interest, elimination of multiple peaks on the spectrum, improved accuracy of center frequency determination, improved MRI images that do not include unwanted artifacts, improved fat suppression effects and more accurate patient diagnoses.

While the embodiments of the disclosed method have been described with reference to exemplary embodiments, it will be understood by those skilled in the art that various changes may be made and equivalents may be substituted for elements thereof without departing from the scope of the embodiments of the disclosed method. In addition, many modifications may be made to adapt a particular situation or material to the teachings of the embodiments of the disclosed method without departing from the essential scope thereof. Therefore, it is intended that the embodiments of the disclosed method not be limited to the particular embodiments disclosed as the best mode contemplated for carrying out the embodiments of the disclosed method, but that the embodiments of the disclosed method will include all embodiments falling within the scope of the appended claims.

What is claimed is:

1. A method for defining and displaying a localized excitation volume within at least one imaging slab within a localizer image configured for MRI imaging of an anatomical object, comprising:

displaying localizer images on a display of an MRI imaging system, the localizer images showing axial, coronal and sagittal planes of sectioned views of the anatomical object;

by way of an operator using a graphical user interface of the MRI imaging system, choosing a region of interest within the localizer images displayed upon a the display, the region of interest being chosen to encompass at least a portion of the anatomical object;

by way of an operator using the graphical user interface, using the localizer images to prescribe at least one imaging slab bisecting the region of interest;

on the MRI imaging system, calculating a localized excitation volume defined by the intersection of the at least one imaging slab and the region of interest; and by way of the MRI imaging system utilizing one of stimulated echo acquisition mode (STEAM), point-resolved spectroscopy (PRESS), or slice-selective 2-D spatial pulse excitation, magnetically exciting only the localized excitation volume, and not portions of the region of interest within the at least one imaging slab but external to the localized excitation volume, thereby reducing image artifacts otherwise displayed via image excitation of a volume of the region of interest outside of the localized excitation volume, resulting in improved MRI images with reduced image artifacts and more accurate patient diagnoses, and displaying the improved MRI images on the display.

2. The method of claim 1 further comprising:

calculating the localized excitation volume as a percentage of the region of interest thereby maintaining the same shape as the region of interest.

3. The method of claim 1 wherein the calculating of the intersection is performed on a center slice of an imaging slab made from multiple slices.

4. A method for measuring an accurate center frequency with respect to a localizer image configured for MRI imaging of an anatomical object, comprising:

displaying localizer images on a display of an MRI imaging system, the localizer images showing axial, coronal and sagittal planes of sectioned views of the anatomical object;

by way of an operator using a graphical user interface of the MRI imaging system, prescribing a region of interest within the localizer image displayed upon the display, the region of interest being chosen to encompass at least a portion of the anatomical object;

by way of an operator using the graphical user interface, using the localizer images to prescribe at least one imaging slab bisecting the region of interest;

on the MRI imaging system. calculating a localized excitation volume defined by the intersection of the at least one imaging slab and the region of interest;

by way of the MRI imaging system utilizing one of stimulated echo acquisition mode (STEAM), point-resolved spectroscopy (PRESS), or slice- selective 2-D spatial pulse excitation, magnetically exciting only the localized excitation volume, and not portions of the region of interest within the at least one imaging slab but external to the localized excitation volume, producing MRI data of the localized excitation volume, and performing a fast Fourier transform (FFT) process on the MRI data to produce a spectrum within a spectral domain representative of the MRI data after the FFT process;

on the MRI imaging system, calculating a center frequency peak for the localized excitation volume in the spectral domain defined by a spectrum frequency absent multiple surrounding peaks;

wherein the calculated center frequency peak absent excitation of a volume of the region of interest outside of the localized excitation volume results in the calculated center frequency peak absent multiple surrounding peaks, thereby reducing image artifacts otherwise displayed via image excitation of a volume of the region of interest outside of the localized excitation volume, resulting in improved MRI images with reduced image artifacts and more accurate patient diagnoses;

wherein the improved MRI images with the calculated center frequency peaks absent multiple surrounding peaks are displayed on the display.

5. The method of claim 4 wherein the spectral domain after a fast Fourier transform (FFT) is performed has a single frequency peak resulting in a highly accurate center frequency peak determination.

6. The method of claim 4 wherein the localized excitation volume of a rectangular prism is excited with a method of point resolved spectroscopy (PRESS).

7. The method of claim 4 wherein the localized excitation volume of a rectangular prism is excited with a method of stimulated echo acquisition mode (STEAM).

8. The method of claim 4 wherein the localized excitation volume of an ellipse is excited with a method of using slice-selective 2D spatial excitation pulse.

9. The method of claim 4 further comprising:

calculating the localized excitation volume as a percentage of the region of interest thereby maintaining the same shape as the region or interest.

10. The method of claim 4 further comprising:

calculating the intersections of the imaging slab with the region of interest to define the localized excitation volume wherein the length, width and orientation of the localized excitation volume are calculated.

11. The method of claim 10 wherein the calculation of the intersection of the region of interest is performed with a center slice of an imaging slab made from multiple slices.

12. A method to reduce image artifacts in MRI imaging of an anatomical object, the method comprising:

displaying localizer images on a display of an MRI system, the localizer images showing axial, coronal and sagittal planes of sectioned views of the anatomical object;

by way of an operator using a control screen of the MRI system, selecting a region of interest of the localization images displayed upon the control screen, the region of interest being chosen to encompass at least a portion of the anatomical object;

by way of an operator using the control screen, using the localizer images to prescribe at least one imaging slab bisecting the region of interest;

on the MRI system, calculating a localized excitation volume defined by the intersection of the at least one imaging slab and the region of interest;

by way of the MRI imaging system utilizing one of stimulated echo acquisition mode (STEAM), point-resolved spectroscopy (PRESS), or slice-selective 2-D spatial pulse excitation, intentionally exciting only the localized excitation volume, and not intentionally exciting portions of the region of interest within the at least one imaging slab but external to the localized excitation volume, producing MRI data of the localized excitation volume and performing a fast Fourier transform (FFT) process on the MRI data to produce a spectrum within a spectral domain representative of the MRI data after the FFT process;

on the MRI imaging system, calculating a center frequency peak for the excited localized volume in the spectral domain defined by a spectrum frequency absent multiple surrounding peaks, thereby reducing image artifacts otherwise displayed via image excitation of a volume of the region of interest outside of the localized excitation volume; and subsequent to the calculating, displaying the region of interest having the reduced image artifacts upon the MRI system control screen to provide more accurate patient diagnoses.

13. The method of claim 12 wherein the spectral domain after a fast Fourier transform (FFT) is performed has a single frequency peak resulting in a highly accurate center frequency peak determination.

14. The method of claim 12 wherein the localized excitation volume of an ellipse is excited with a method of using slice-selective 2D spatial excitation pulse.

15. The method of claim 12 further comprising:

calculating the localized excitation volume as a percentage of the region of interest thereby maintaining the same shape as the region or interest.

16. The method of claim 12 further comprising:

calculating the intersections of the imaging slab with the region of interest to define the localized excitation volume wherein the length, width and orientation of the localized excitation volume are calculated.

17. The method of claim 16 wherein the calculation of the intersection of the region of interest is performed with a center slice of an imaging slab made from multiple slices.

\* \* \* \* \*